(12) United States Patent
Cheng

(10) Patent No.: US 9,175,389 B2
(45) Date of Patent: Nov. 3, 2015

(54) ALD PROCESS WINDOW COMBINATORIAL SCREENING TOOL

(71) Applicant: Intermolecular, Inc., San Jose, CA (US)

(72) Inventor: Jeremy Cheng, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 542 days.

(21) Appl. No.: 13/725,877

(22) Filed: Dec. 21, 2012

(65) Prior Publication Data

US 2014/0174540 A1 Jun. 26, 2014

(51) Int. Cl.
| | |
|---|---|
| *C23C 16/455* | (2006.01) |
| *C23C 16/52* | (2006.01) |
| *C23C 16/54* | (2006.01) |
| *C23C 16/44* | (2006.01) |
| *H01L 21/67* | (2006.01) |
| *C23C 14/56* | (2006.01) |

(52) U.S. Cl.
CPC ..... *C23C 16/45544* (2013.01); *C23C 16/45525* (2013.01); *C23C 16/45527* (2013.01); *C23C 16/45529* (2013.01); *C23C 16/52* (2013.01); *C23C 14/568* (2013.01); *C23C 16/4401* (2013.01); *C23C 16/4412* (2013.01); *C23C 16/54* (2013.01); *H01L 21/67017* (2013.01); *Y10T 137/0318* (2015.04); *Y10T 137/85938* (2015.04)

(58) Field of Classification Search
CPC .......... C23C 16/45525; C23C 16/45527; C23C 16/45529; C23C 16/54; C23C 16/4412; C23C 14/568; C23C 16/4401; H01L 21/67017

USPC .............. 118/719; 156/345.22; 427/248.1
See application file for complete search history.

(56) References Cited

U.S. PATENT DOCUMENTS

| | | | | |
|---|---|---|---|---|
| 5,380,396 | A  * | 1/1995 | Shikida et al. | 216/2 |
| 5,711,811 | A  * | 1/1998 | Suntola et al. | 118/719 |
| 6,015,590 | A  * | 1/2000 | Suntola et al. | 427/255.23 |
| 6,293,222 | B1 * | 9/2001 | Paquet | 118/723 ME |
| 6,502,530 | B1 * | 1/2003 | Turlot et al. | 118/723 E |
| 6,572,705 | B1 * | 6/2003 | Suntola et al. | 118/702 |
| 6,586,886 | B1 * | 7/2003 | Katz et al. | 315/111.21 |
| 6,852,167 | B2 * | 2/2005 | Ahn | 118/715 |
| 6,921,437 | B1 * | 7/2005 | DeDontney et al. | 118/715 |
| 7,060,132 | B2 * | 6/2006 | Lindfors et al. | 117/93 |
| 7,381,052 | B2 * | 6/2008 | Zhao et al. | 432/249 |
| 7,404,984 | B2 * | 7/2008 | Suntola et al. | 427/248.1 |
| 7,413,982 | B2 * | 8/2008 | Levy | 438/680 |
| 7,456,429 | B2 * | 11/2008 | Levy | 257/66 |
| 7,972,898 | B2 * | 7/2011 | Cowdery-Corvan et al. | 438/104 |
| 8,528,498 | B2 * | 9/2013 | Benjamin | 118/723 R |
| 2002/0041931 | A1 * | 4/2002 | Suntola et al. | 427/255.28 |
| 2004/0191413 | A1 * | 9/2004 | Park et al. | 427/255.28 |
| 2005/0235915 | A1 * | 10/2005 | Ho et al. | 118/723 E |
| 2006/0196424 | A1 * | 9/2006 | Swallow et al. | 118/723 E |
| 2006/0292845 | A1 * | 12/2006 | Chiang et al. | 438/597 |
| 2007/0228470 | A1 * | 10/2007 | Levy | 257/348 |
| 2008/0166880 | A1 * | 7/2008 | Levy | 438/758 |
| 2009/0081360 | A1 * | 3/2009 | Fedorovskaya et al. | 427/160 |
| 2009/0130858 | A1 * | 5/2009 | Levy | 438/765 |
| 2010/0001269 | A1 * | 1/2010 | Verma et al. | 257/48 |

(Continued)

*Primary Examiner* — Rudy Zervigon

(57) ABSTRACT

Systems and apparatus are described that facilitate the evaluation and characterization of ALD processes as a function of process parameters such as temperature, gas flow rate, and pressure. In some embodiments, systems and apparatus are described that allow the ALD process to be characterized at different pressures in a combinatorial manner.

14 Claims, 11 Drawing Sheets

(56) References Cited

U.S. PATENT DOCUMENTS

| | | | |
|---|---|---|---|
| 2010/0143601 A1* | 6/2010 | Hawtof et al. | 427/446 |
| 2011/0097493 A1* | 4/2011 | Kerr et al. | 427/255.5 |
| 2012/0003497 A1* | 1/2012 | Handy et al. | 428/615 |
| 2012/0141676 A1* | 6/2012 | Sershen et al. | 427/255.23 |
| 2012/0298037 A1* | 11/2012 | Paul et al. | 118/712 |
| 2012/0321786 A1* | 12/2012 | Satitpunwaycha et al. | 427/252 |
| 2013/0093049 A1* | 4/2013 | Ananthan et al. | 257/532 |
| 2013/0109126 A1* | 5/2013 | Van Duren et al. | 438/71 |
| 2013/0115764 A1* | 5/2013 | Pederson et al. | 438/514 |
| 2013/0125818 A1* | 5/2013 | Wright et al. | 118/723 R |
| 2013/0130414 A1* | 5/2013 | Li et al. | 438/17 |
| 2013/0130481 A1* | 5/2013 | Chua et al. | 438/493 |
| 2013/0133746 A1* | 5/2013 | Kelekar | 137/1 |
| 2013/0146588 A1* | 6/2013 | Child | 219/634 |
| 2013/0149077 A1* | 6/2013 | Lowe et al. | 414/222.01 |
| 2013/0167773 A1* | 7/2013 | Yang et al. | 118/720 |
| 2013/0295748 A1* | 11/2013 | Liang et al. | 438/478 |
| 2013/0316472 A1* | 11/2013 | Joshi et al. | 438/17 |
| 2014/0038345 A1* | 2/2014 | Liang | 438/95 |
| 2014/0057371 A1* | 2/2014 | Foster | 438/14 |
| 2014/0080250 A1* | 3/2014 | Liang et al. | 438/95 |
| 2014/0124038 A1* | 5/2014 | Mariserla et al. | 137/14 |
| 2014/0141534 A1* | 5/2014 | Phatak et al. | 438/5 |
| 2014/0147587 A1* | 5/2014 | Endo et al. | 427/240 |
| 2014/0151333 A1* | 6/2014 | Gottscho et al. | 216/67 |
| 2014/0154859 A1* | 6/2014 | Gopal et al. | 438/382 |
| 2014/0162384 A1* | 6/2014 | Joshi | 438/17 |
| 2014/0166616 A1* | 6/2014 | Shanker et al. | 216/67 |
| 2014/0170335 A1* | 6/2014 | Shao et al. | 427/569 |
| 2014/0174540 A1* | 6/2014 | Cheng | 137/1 |
| 2014/0178578 A1* | 6/2014 | Zhang et al. | 427/162 |
| 2014/0179033 A1* | 6/2014 | Mathur et al. | 438/17 |
| 2014/0179113 A1* | 6/2014 | Lang et al. | 438/758 |
| 2014/0179123 A1* | 6/2014 | Korczynski et al. | 438/795 |
| 2014/0272454 A1* | 9/2014 | Zhang et al. | 428/623 |
| 2014/0273314 A1* | 9/2014 | Hashim | 438/17 |
| 2014/0273333 A1* | 9/2014 | Liang et al. | 438/85 |
| 2014/0273340 A1* | 9/2014 | Van Duren et al. | 438/104 |
| 2015/0140696 A1* | 5/2015 | Ahmed | 438/17 |
| 2015/0170908 A1* | 6/2015 | Hsueh et al. | H01L 21/67276 |
| 2015/0179487 A1* | 6/2015 | Chen et al. | H01L 21/02271 |
| 2015/0187664 A1* | 7/2015 | Joshi | H01L 21/28026 |
| 2015/0191815 A1* | 7/2015 | Ding et al. | C23C 14/08 |

* cited by examiner

| Temperature (C) | Deposition Rate @ 0.25 Torr (A/cycle) | Deposition Rate @ 2.5 Torr (A/cycle) |
|---|---|---|
| 280 | 2.15 | 3.25 |
| 300 | 2.25 | 4.00 |
| 320 | 2.50 | 5.25 |
| 360 | 3.00 | 7.00 |

FIG. 3

| 400 | 350 | 300 | 250 | 200 | 150 | 100 | 50  |
|-----|-----|-----|-----|-----|-----|-----|-----|
| 350 | 300 | 250 | 200 | 150 | 100 | 50  | 400 |
| 300 | 250 | 200 | 150 | 100 | 50  | 400 | 350 |
| 250 | 200 | 150 | 100 | 50  | 400 | 350 | 300 |
| 200 | 150 | 100 | 50  | 400 | 350 | 300 | 250 |
| 150 | 100 | 50  | 400 | 350 | 300 | 250 | 200 |
| 100 | 50  | 400 | 350 | 300 | 250 | 200 | 150 |
| 50  | 400 | 350 | 300 | 250 | 200 | 150 | 100 |

FIG. 11

ALD PROCESS WINDOW COMBINATORIAL SCREENING TOOL

TECHNICAL FIELD

The present disclosure relates generally to systems and apparatus used to investigate the process window for atomic layer deposition processes.

BACKGROUND

Atomic layer deposition (ALD) is a deposition process used to form thin layers on complex structures found in many advanced semiconductor devices. The general steps of the ALD process are well known and typically consist of i) exposing the substrate to a precursor pulse to form a monolayer of the precursor on the surface; ii) purging unreacted precursor from the system; iii) exposing the substrate to a reactant (i.e. usually an oxidant) pulse to form a layer of material on the substrate; iv) purging unreacted reactant from the system; and v) repeating steps i)-iv) until a layer of the desired thickness is formed.

Ideally, the exposure of the substrate to the precursor pulse forms a saturated, self-limiting monolayer on the surface. This has the added benefit that the growth of the layer will be conformal. This benefit makes ALD processes especially useful for depositing thin layers on complex structures found in many advanced semiconductor devices. Because of the self-limiting nature of the deposition, the conformality is expected to be approximately 100% and the deposition should be insensitive to pressure. However, in practice, the conformality is not 100% and the deposition rate is observed to vary as a function of pressure. Therefore, systems and apparatus are needed to efficiently evaluate and characterize the deposition of materials using an ALD technique as a function of different process parameters.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, systems and apparatus are described that facilitate the evaluation and characterization of ALD processes as a function of process parameters such as temperature, gas flow rate, and pressure. In some embodiments, systems and apparatus are described that allow the ALD process to be characterized at eight different pressures in a combinatorial manner.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 3 presents data for ALD deposition rate at two pressures for a range of temperatures.

FIG. 11 is a table illustrating the decrease in depth of the process regions according to some embodiments.

DETAILED DESCRIPTION

Figure 1:
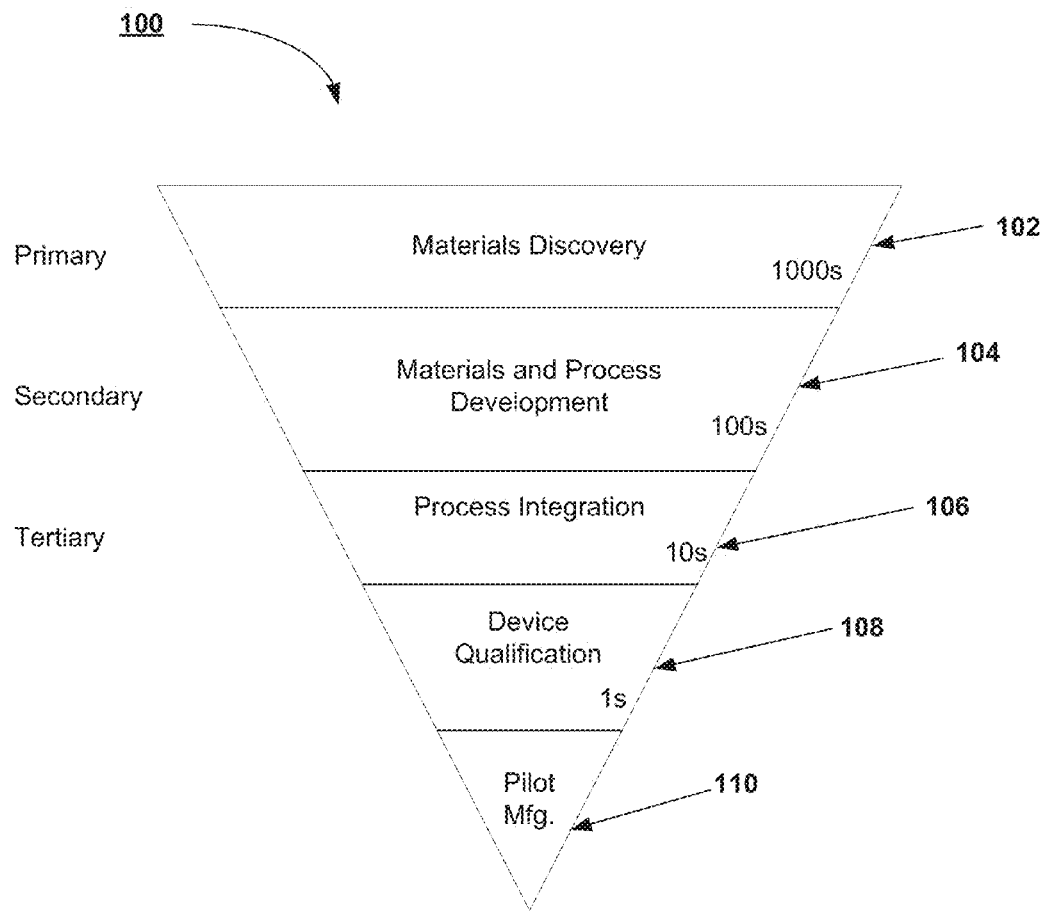
FIG. 1 is a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The performance of semiconductor devices depends on many properties of the absorber layer and the buffer layer such as crystallinity, grain size, composition uniformity, density, defect concentration, doping level, surface roughness, etc.

The manufacture of semiconductor devices entails the integration and sequencing of many unit processing steps. As an example, semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as semiconductor devices. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching, texturing, polishing, cleaning, etc. HPC processing techniques have also been successfully adapted to deposition processes such as sputtering, atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
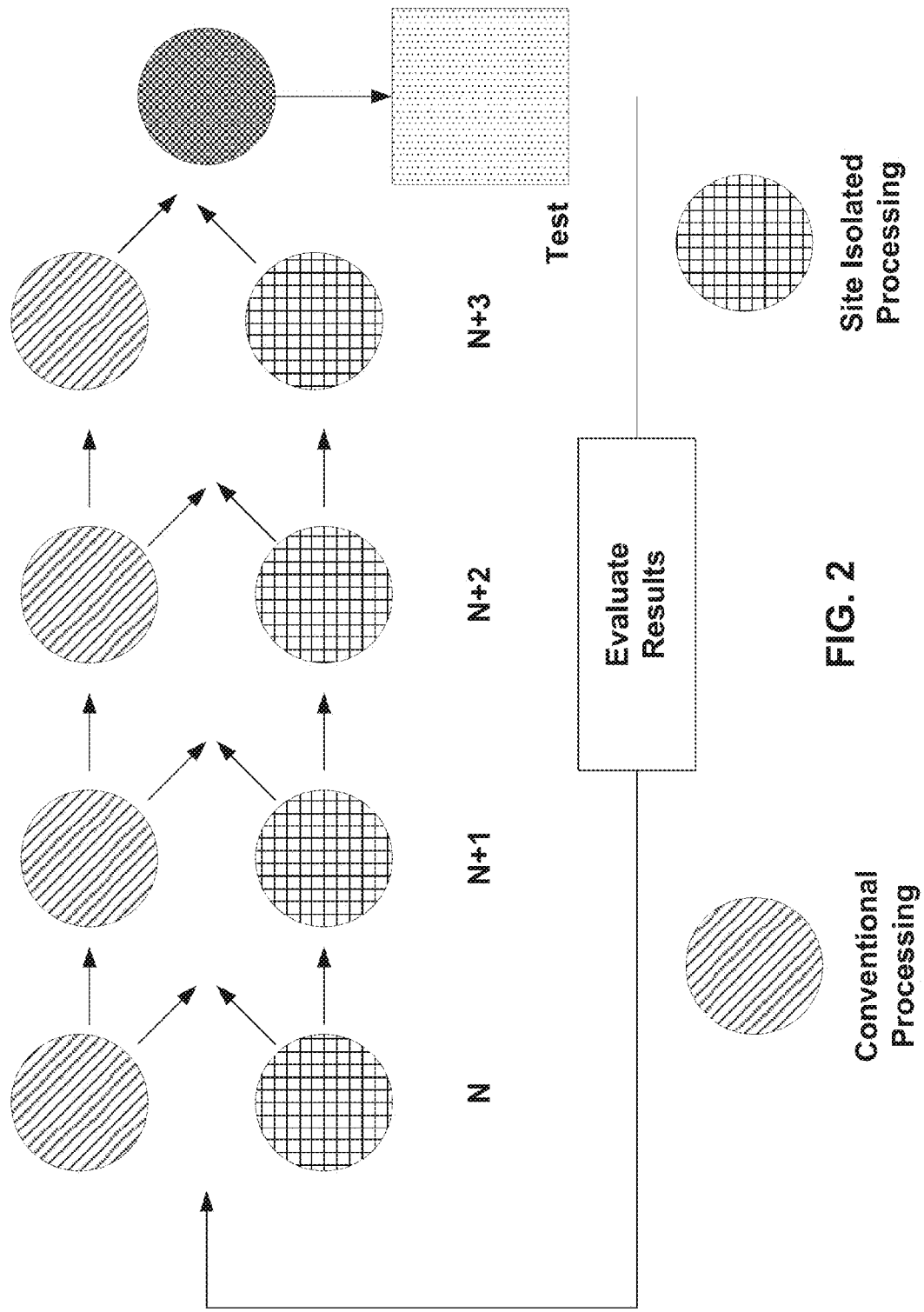
FIG. 2 is a schematic diagram for illustrating various process sequences using combinatorial processing and evaluation.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. The combinatorial processing may employ uniform processing of site isolated regions or may employ gradient techniques. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. However, in some embodiments, the processing may result in a gradient within the regions. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

As discussed previously, ALD processes do not provide the benefits of 100% conformality and insensitivity to pressure that are predicted by theory. In practice, the thickness observed at the top of high aspect ratio structures is greater than the thickness observed at the bottom and on the sidewalls of high aspect ratio structures. In practice, the deposition rate is observed to increase at higher pressures for many ALD processes. This is illustrated in the data presented in FIG. 3 wherein the ALD deposition rate is observed to increase significantly from 0.25 Torr to 2.50 Torr across a wide temperature range from 280 C to 360 C. These observations indicate that the deposition of materials using an ALD technique does not strictly follow the idealized ALD deposition mechanism, but is a combination of the ALD deposition mechanism and a traditional chemical vapor deposition (CVD) mechanism.

The change of the ALD deposition rate as a function of typical process parameters such as gas flow, pressure, and temperature dictates that each ALD process must be evaluated and characterized across a wide range of the process parameter space. This can be a time consuming and costly endeavor. As discussed previously, HPC techniques can be used to reduce the time and the costs associated with the characterization of thin film deposition techniques.

Figure 4:
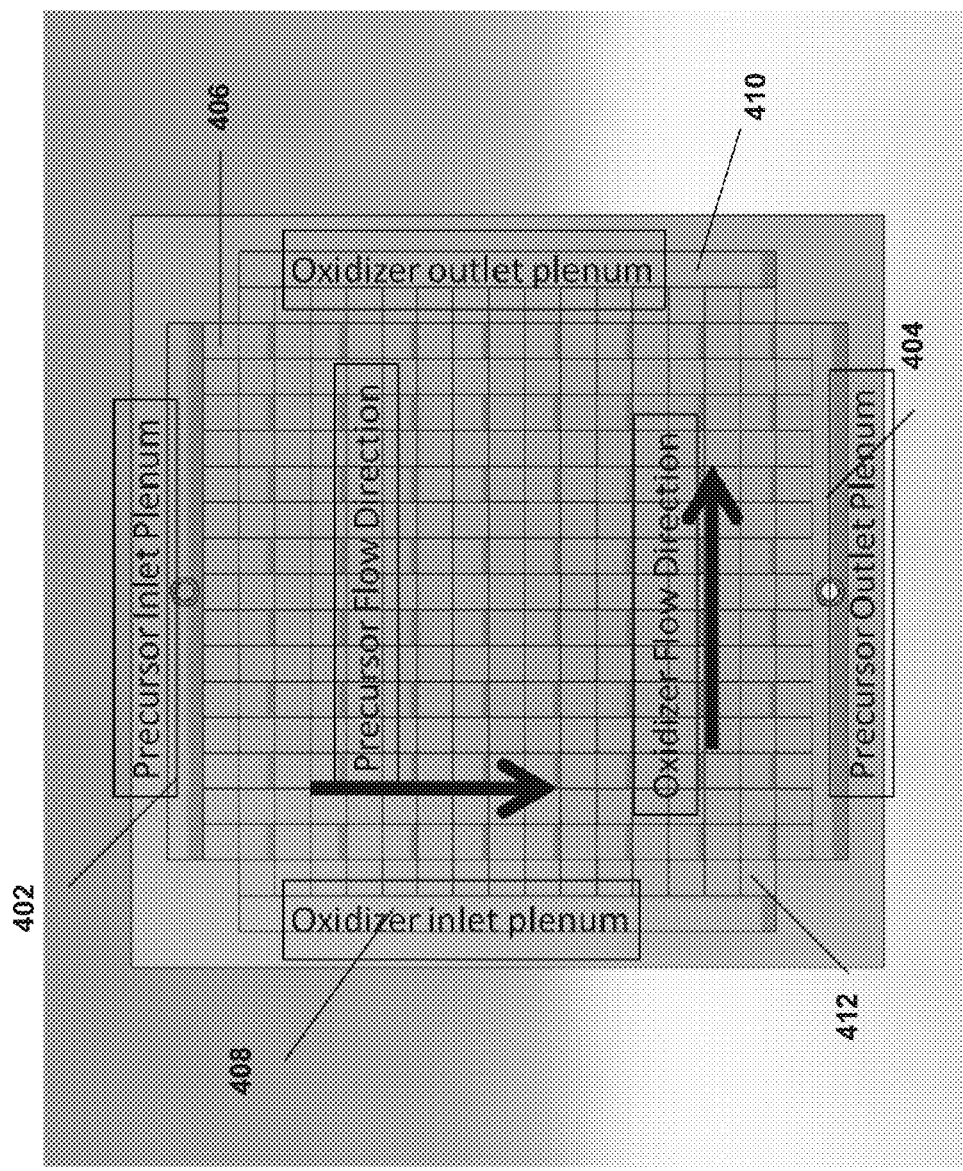
FIG. 4 is a schematic diagram for an apparatus according to some embodiments.

FIG. 4 presents a schematic of an apparatus that can be used to characterize ALD deposition processes as a function of pressure. The apparatus includes an orthogonal array of intersecting flow channels. As illustrated in FIG. 4, the precursor would be introduced from a precursor inlet manifold, 402, indicated at the top of the figure and would exit at a precursor outlet manifold, 404, indicated at the bottom of the figure. The precursor would flow through eight channels (i.e. 406 indicates one channel) from the top of the figure to the bottom of the figure. Although eight channels are illustrated in FIG. 4, those skilled in the art will understand that any number of channels may be used and the eight channels illustrated in FIG. 4 are not meant to be limiting. Precursor flow restrictions designed into each channel result in a pressure drop within each channel from the top of FIG. 4 to the bottom along each channel. Therefore, site-isolated regions of the substrate exposed to each flow channel at the top of the figure will experience a deposition under higher pressures than site-isolated regions of the substrate exposed to each flow channel at the bottom of the figure.

As illustrated in FIG. 4, the reactant (i.e. usually an oxidant) would be introduced from a reactant inlet manifold, 408, indicated at the left of the figure and would exit at a reactant outlet manifold, 410, indicated at the right of the figure. The reactant would flow through eight channels (i.e. 412 indicates one channel) from the left of the figure to the right of the figure. Although eight channels are illustrated in FIG. 4, those skilled in the art will understand that any number of channels may be used and the eight channels illustrated in FIG. 4 are not meant to be limiting. Reactant flow restrictions designed into each channel result in a pressure drop within each channel from the left of FIG. 4 to the right along each channel. Therefore, site-isolated regions of the substrate exposed to each flow channel at the left of the figure will experience a deposition under higher pressures than site-isolated regions of the substrate exposed to each flow channel at the right of the figure. In some embodiments, the apparatus is formed from a material that is easily machined to tight tolerances. In some embodiments, the apparatus is formed from aluminum.

Figure 5:
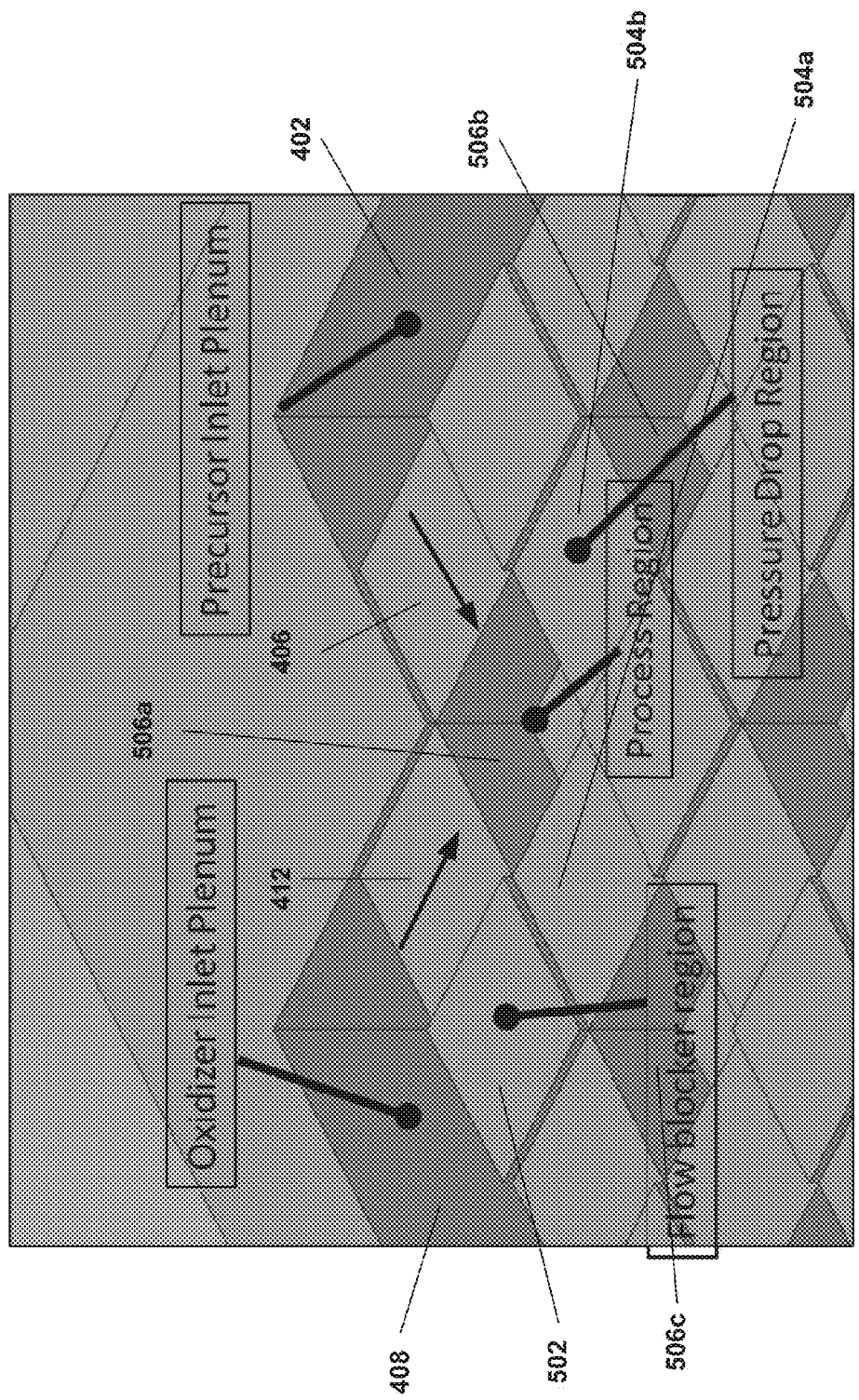
FIG. 5 is a schematic diagram for an apparatus according to some embodiments.
Figure 6:
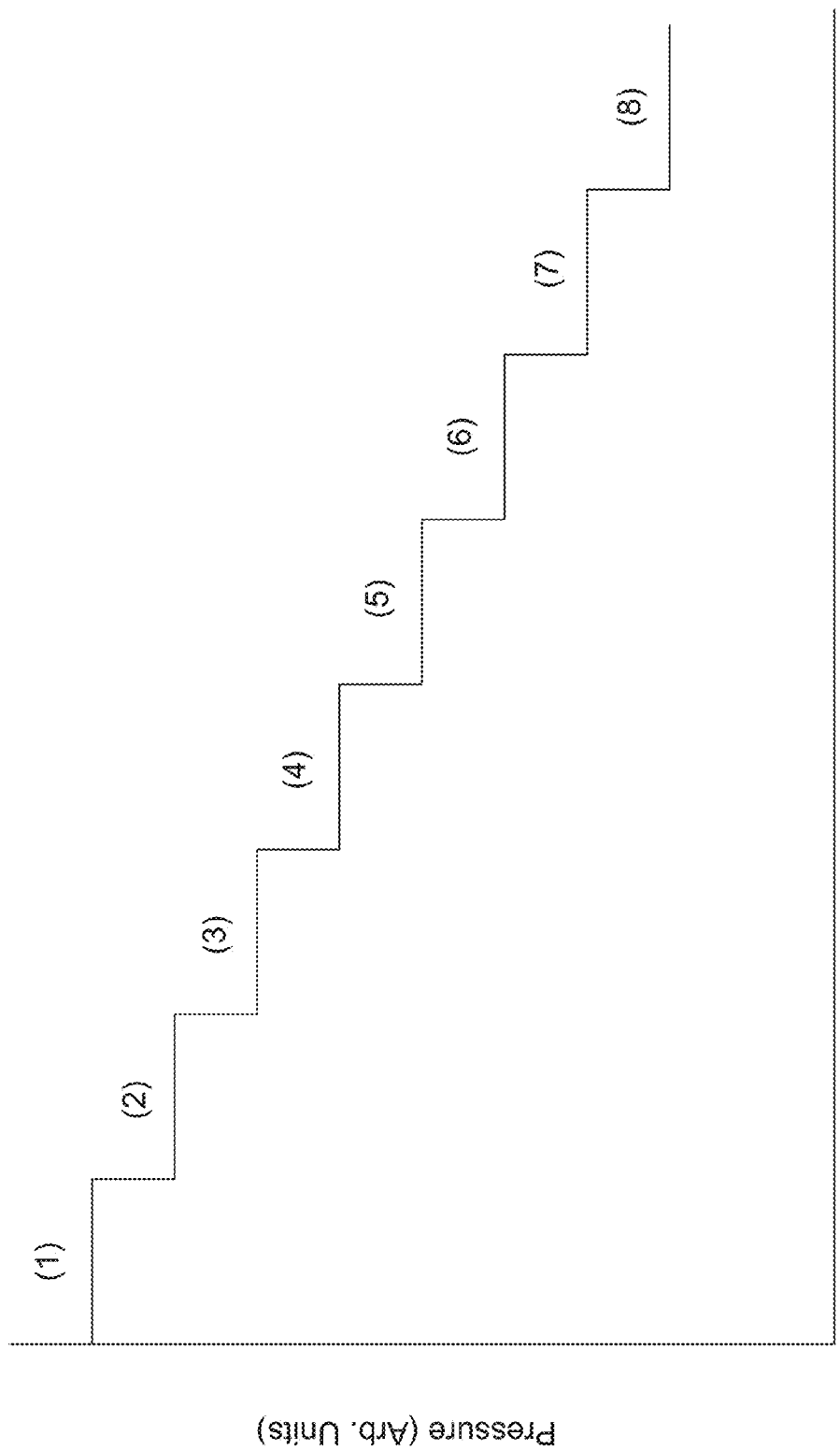
FIG. 6 is a schematic diagram for illustrating the decrease in pressure along one of the flow channels according to some embodiments.

FIG. 5 illustrates a more detailed schematic of the intersection of one of the precursor flow channels, 406, with one of the reactant flow channels, 412. In FIG. 5, the apparatus is viewed from the bottom, or underside of the apparatus. That is, the flow blocking regions, 502, would be in contact with the substrate and effectively form a seal with the substrate to prevent gases flowing within the flow channels from interacting with gases in adjacent flow channels. In FIG. 5, the precursor inlet manifold, 402, and the reactant inlet manifold, 408, are illustrated. One of the precursor flow channels, 406, and one of the reactant flow channels, 412, are also labeled. Along each precursor flow channel, 406, are precursor flow restrictors, 504a, that result in pressure drop regions. Along each reactant flow channel, 412, are reactant flow restrictors, 504b, that result in pressure drop regions. The regions where the precursor flow channel and the reactant flow channels intersect form process regions, 506a-c. Because of the flow restrictors along each flow channel, the pressure in process region is higher than the pressure in process regions 506b or 506c. Similarly, the pressure would decrease between each successive process region as the gas flows along the flow channels. This concept is illustrated in FIG. 6 where the pressure is shown as decreasing in a step-wide manner as the gas flows from the first process region (i.e. "(1)") to the last process region (i.e. "(8)") along one of the flow paths. The decrease in pressure between adjacent process regions along the flow channel illustrated in FIG. 6 is indicated as being constant. The decrease in pressure between adjacent process regions along the flow channel illustrated in FIG. 6 will depend on the input flow rate. Table 1 presents calculated data for the pressure within each region (in Torr) as a function of input flow rate (e.g. between 0.1 SLPM to 2.0 SLPM). Those skilled in the art will understand that the flow restrictors can be designed so that the decrease in pressure between adjacent process regions can vary along the flow channel. Therefore, the process regions form site-isolated regions on the substrate where the material deposited within each site-isolated region is deposited under different process conditions.

TABLE 1

| | | Total Gas Flow (SLPM) | | | | | |
|---|---|---|---|---|---|---|---|
| | | 0.1 | 0.2 | 0.3 | 0.5 | 1 | 2 |
| Process Region | 1 | 1.90 | 2.80 | 3.70 | 5.49 | 9.99 | 18.98 |
| | 2 | 1.79 | 2.57 | 3.36 | 4.93 | 8.86 | 16.73 |
| | 3 | 1.67 | 2.35 | 3.02 | 4.37 | 7.74 | 14.48 |
| | 4 | 1.56 | 2.12 | 2.69 | 3.81 | 6.62 | 12.23 |
| | 5 | 1.45 | 1.90 | 2.35 | 3.25 | 5.49 | 9.99 |
| | 6 | 1.34 | 1.67 | 2.01 | 2.69 | 4.37 | 7.74 |
| | 7 | 1.22 | 1.45 | 1.67 | 2.12 | 3.25 | 5.49 |
| | 8 | 1.11 | 1.22 | 1.34 | 1.56 | 2.12 | 3.25 |

Figure 7:
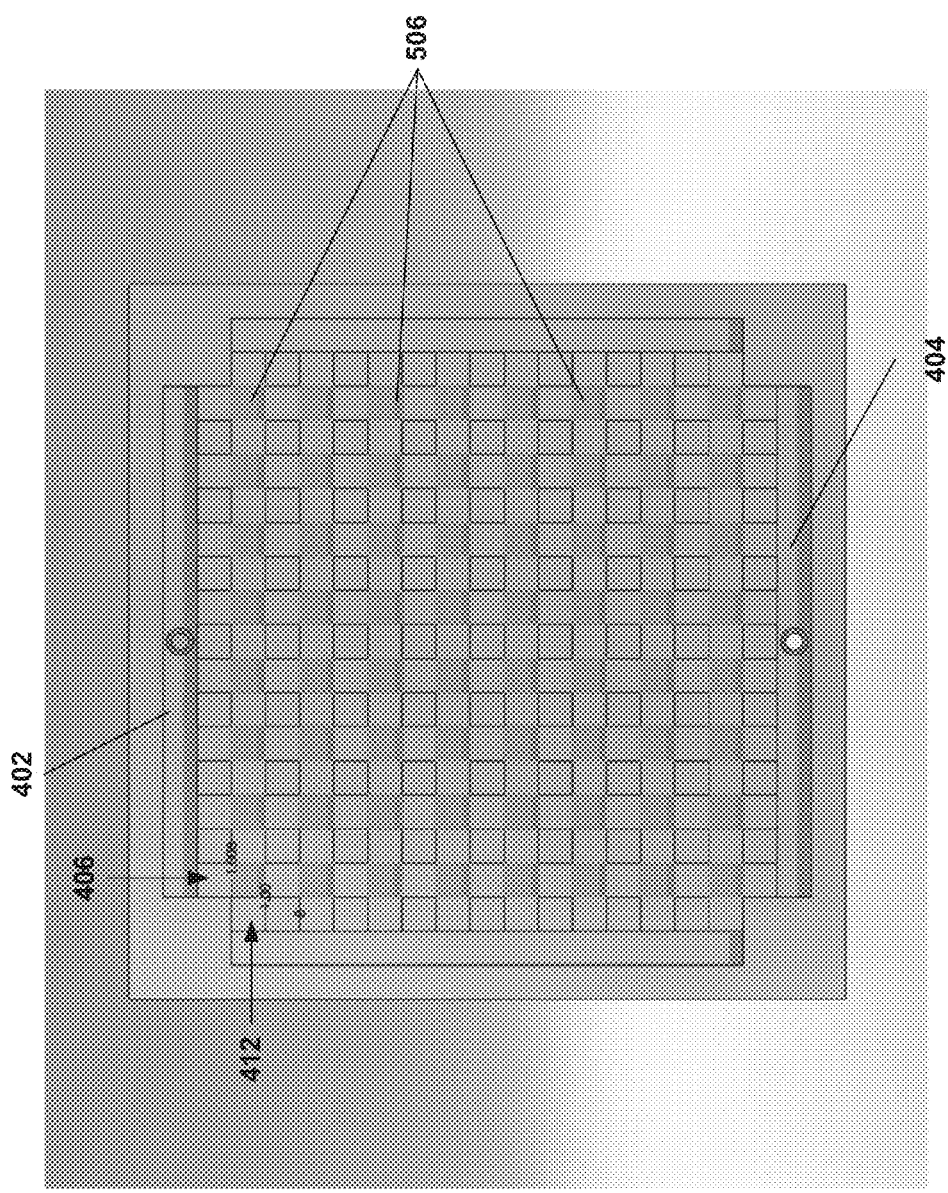
FIG. 7 is a schematic diagram for an apparatus according to some embodiments.

FIG. 7 illustrates a schematic of the apparatus where the process regions, 506, have been highlighted. The precursor inlet manifold, 402, and precursor outlet manifold, 404 are also indicated. One of the precursor flow channels, 406, and one of the reactant flow channels, 412, are also indicated. The combination of eight precursor flow channels and eight reactant flow channels results in sixty-four process regions resulting in sixty-four site-isolated regions on the substrate. This configuration allows up to sixty-four pressure settings to be tested during a deposition experiment. In some embodiments, the depth of each of the process regions is between 0.2 inches and 0.55 inches. In some embodiments, the length and width of each of the process regions are each between 0.75 inches and 0.9 inches.

Figure 8:
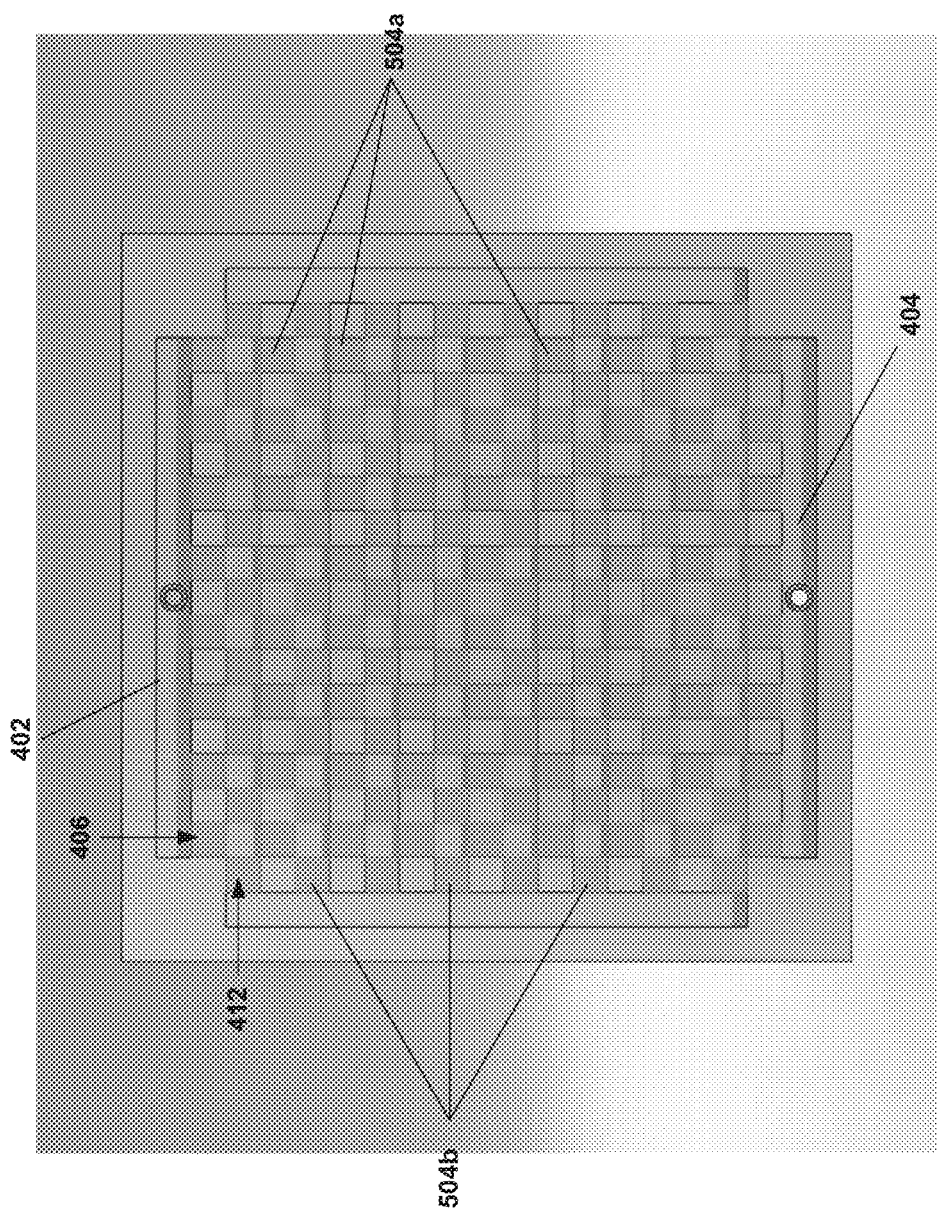
FIG. 8 is a schematic diagram for an apparatus according to some embodiments.

FIG. 8 illustrates a schematic of the apparatus where the precursor flow restrictors, 504a, and reactant flow restrictors, 504b, (and associated pressure drop regions) have been highlighted. The precursor inlet manifold, 402, and precursor outlet manifold, 404 are also indicated. One of the precursor flow channels, 406, and one of the reactant flow channels, 412, are also indicated. In some embodiments, the flow restrictors within the channels form a gap of about 0.050 inches to about 0.150 inches between the flow restrictor and the substrate surface. In some embodiments, this will result in a pressure drop of about 0.1 Torr to about 1.75 Torr between adjacent process regions. Those skilled in the art will understand that the pressure drop between adjacent process regions will depend on the flow rate of the gases introduced into the inlet manifolds.

Figure 9:
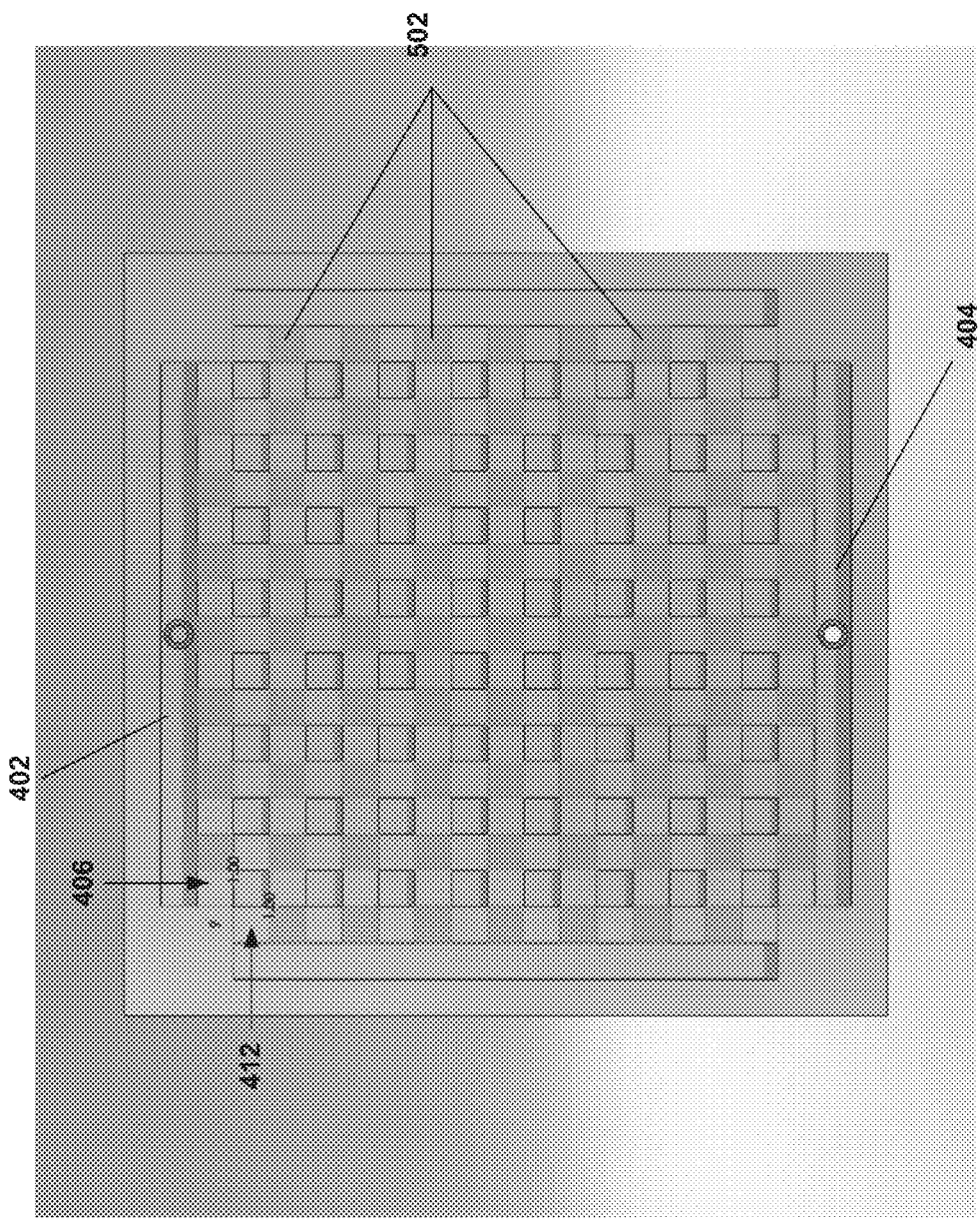
FIG. 9 is a schematic diagram for an apparatus according to some embodiments.

FIG. 9 illustrates a schematic of the apparatus where the flow blocking regions, 502, have been highlighted. The precursor inlet manifold, 402, and precursor outlet manifold, 404 are also indicated. One of the precursor flow channels, 406, and one of the reactant flow channels, 412, are also indicated. In some embodiments, the flow blocking regions are in contact with the surface of the substrate and serve to both prevent gases between adjacent flow channels from intermixing, but also serve to define the site-isolated regions on the surface of the substrate.

Figure 10:
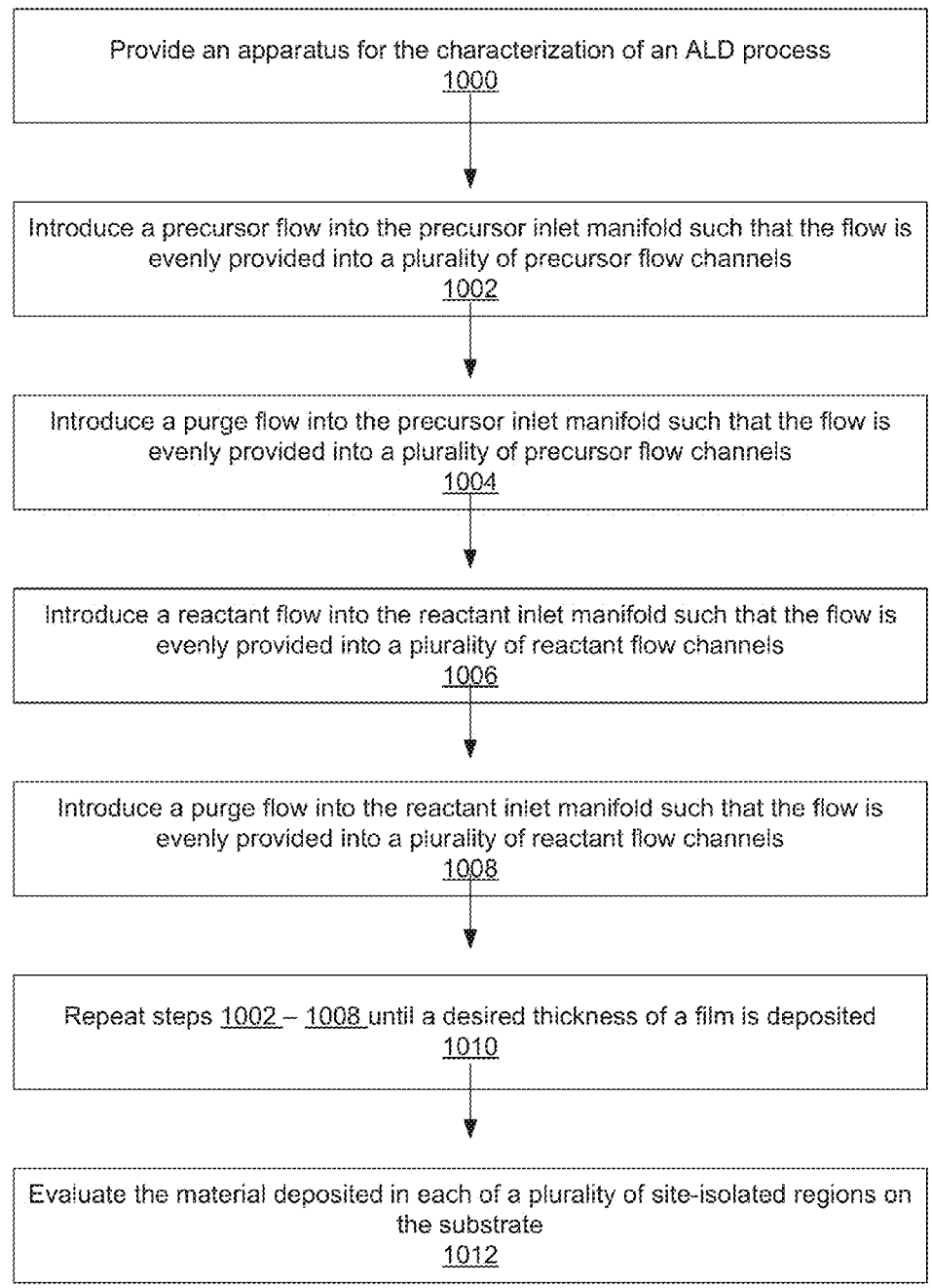
FIG. 10 is a flow chart according to some embodiments.

FIG. 10 illustrates a flow chart that describes a method of using an apparatus such as that described in reference to FIGS. 4-9. In step 1000, an apparatus designed to characterize an ALD process is provided. The apparatus may have the features described previously with respect to FIGS. 4-9. In step 1002, a precursor flow is introduced to the precursor inlet manifold. As discussed previously, the flow is evenly directed into a plurality of precursor flow channels. As discussed previously, restrictors within each of the plurality of precursor flow channels result in a decrease in pressure as the gas flows from the precursor inlet manifold to a precursor outlet manifold. As discussed previously, as the precursor gases flow along the plurality of flow channels, they will adsorb onto site-isolated regions on the surface of the substrate in the process regions of the apparatus. In step 1004, a purge flow is introduced to the precursor inlet manifold to remove unreacted precursor from the process regions and the precursor flow channels. In step 1006, a reactant flow is introduced to the reactant inlet manifold. As discussed previously, the flow is evenly directed into a plurality of reactant flow channels. As discussed previously, restrictors within each of the plurality of reactant flow channels result in a decrease in pressure as the gas flows from the reactant inlet manifold to a reactant outlet manifold. As discussed previously, as the reactant gases flow along the plurality of flow channels, they will react with precursor molecules that were previously adsorbed onto the surface of the substrate in the process regions of the apparatus to form a layer of a material. In step 1008, a purge flow is introduced to the reactant inlet manifold to remove unreacted reactant from the process regions and the reactant flow channels. Steps 1002-1008 represent a single cycle of an ALD deposition process. In step 1010, steps 1002-1008 are repeated as necessary until a desired thickness of the material is deposited. In step 1012, each of the site-isolated regions on the substrate is evaluated to characterize a property of the material as a function of deposition pressure. In some embodiments, the method as described in FIG. 10 can be repeated at different precursor flow rates, different reactant flow rates, and at different temperatures to evaluate the ALD process across a wide range of process parameters.

In some embodiments, a variation of the apparatus described previously can be designed. In some embodiments, the precursor and the reactant gas flows use the same inlet manifold and flow channels, but the flows are separated in time. In some embodiments, the depths of the process regions (i.e. 506) are varied across the apparatus. The variation in the depth of the process regions within the apparatus varies the volume of the reaction space above each site-isolated region on the surface of the substrate. This will result in a change in the velocity profile across the surface between the plurality of site-isolated regions on the surface of the substrate. As an example, FIG. 11 lists a matrix of depths of the process regions in "mils" (i.e. thousandths of an inch).

Although the foregoing examples have been described in some detail for purposes of clarity of understanding, the invention is not limited to the details provided. There are many alternative ways of implementing the invention. The disclosed examples are illustrative and not restrictive.

What is claimed:

1. A apparatus for use in an Atomic Layer Deposition (ALD) process, the apparatus comprising:
a precursor inlet manifold;
a plurality of precursor flow channels coupled to the precursor inlet manifold;
a reactant inlet manifold;
a plurality of reactant flow channels coupled to the reactant inlet manifold;
wherein the plurality of precursor flow channels and the plurality of reactant flow channels are arranged orthogonally to each other;
wherein each precursor flow channel further comprises a plurality of precursor flow restrictors that are operable to result in a decrease of a pressure along each precursor flow channel; and
wherein each reactant flow channel further comprises a plurality of reactant flow restrictors that are operable to result in a decrease of a pressure along each reactant flow channel.

2. The apparatus of claim 1 further comprising flow blocking regions operable to isolate the plurality of precursor flow channels from one another.

3. The apparatus of claim 1 further comprising flow blocking regions operable to isolate the plurality of reactant flow channels from one another.

4. The apparatus of claim 1 wherein a process region is formed at each intersection of a precursor flow channel and a reactant flow channel.

5. The apparatus of claim 4 wherein each process region has a length of between 0.75 inches 0.9 inches.

6. The apparatus of claim 4 wherein each process region has a width of between 0.75 inches 0.9 inches.

7. The apparatus of claim 4 wherein each process region has a depth of between 0.2 inches and 0.55 inches.

8. The Apparatus of claim 4 wherein a depth of each process region is varied across the process regions.

9. The apparatus of claim 1 wherein each of the precursor flow restrictors forms a gap to a surface of a substrate of between 0.05 inches to 0.15 inches.

10. The apparatus of claim 1 wherein each of the reactant flow restrictors forms a gap to a surface of a substrate of 0.05 inches to 0.15 inches.

11. A method for characterizing an ALD process, the method comprising:
a. providing an apparatus, the apparatus further comprising:
a precursor inlet manifold;
a plurality of precursor flow channels coupled to the precursor inlet manifold;
a reactant inlet manifold;
a plurality of reactant flow channels coupled to the reactant inlet manifold;
wherein the plurality of precursor flow channels and the plurality of reactant flow channels intersect in an orthogonal configuration to form a plurality of process regions;
wherein each precursor flow channel further comprises a plurality of precursor flow restrictors that are operable to result in a decrease of a pressure along each precursor flow channel; and
wherein each reactant flow channel further comprises a plurality of reactant flow restrictors that are operable to result in a decrease of a pressure along each reactant flow channel;
b. flowing a precursor into the precursor inlet manifold, wherein the flow is evenly provided to the plurality of precursor flow channels, wherein the precursor adsorbs on a surface of a site-isolated region of a substrate disposed under each process region;
c. flowing a purge into a precursor inlet manifold, wherein the flow is evenly provided to a plurality of precursor flow channels;
d. flowing a reactant into the reactant inlet manifold, wherein the flow is evenly provided to the plurality of reactant flow channels, wherein the reactant reacts with the precursor on the surface of the site-isolated region of the substrate disposed under each process region to form a layer of a material;

e. flowing a purge into a reactant inlet manifold, wherein the flow is evenly provided to a plurality of reactant flow channels;
f. repeating steps b-e until a desired thickness of a material is deposited; and
g. evaluating a property of the material at each site-isolated region.

12. The method of claim 11 further comprising repeating steps a-g on a second substrate at a different temperature.

13. The method of claim 11 further comprising repeating steps a-g on a second substrate at a different precursor flow rate.

14. The method of claim 11 further comprising repeating steps a-g on a second substrate at a different reactant flow rate.

* * * * *